United States Patent [19]

Mogilevsky et al.

[11] 3,939,402

[45] Feb. 17, 1976

[54] OSCILLOGRAPHIC FERROMETER

[76] Inventors: Vitaly Moritsovich Mogilevsky, ulitsa O. Zhilinoi, 92-b, kv. 23; Vadim Petrovich Ekimov, ulitsa Schetinkina, 48, kv. 33; Alexandr Petrovich Erastov, ulitsa B. Bogatkova, 205, kv. 15; Viktor Vladimirovich Posokhin, ulitsa A. Lezhena, 30, kv. 35, all of Novosibirsk, U.S.S.R.

[22] Filed: Jan. 6, 1975

[21] Appl. No.: 538,854

[52] U.S. Cl. ............................................. 324/34 R
[51] Int. Cl.[2] ........................................ G01R 33/14
[58] Field of Search ................................... 324/34 R

[56] References Cited
UNITED STATES PATENTS

| | | | |
|---|---|---|---|
| 3,358,224 | 12/1967 | Mogilevsky et al. | 324/34 R |
| 3,500,180 | 3/1970 | Mogilevsky | 324/34 R |

FOREIGN PATENTS OR APPLICATIONS

| | | | |
|---|---|---|---|
| 192,936 | 5/1967 | U.S.S.R. | 324/34 R |

*Primary Examiner*—Robert J. Corcoran
*Attorney, Agent, or Firm*—Waters, Schwartz & Nissen

[57] ABSTRACT

An oscillographic ferrometer comprising a magnetizing means including a step-down transformer and a single-layer ellipsoidal solenoid connected to a single-turn secondary winding of said step-down transformer and having a constant turns density along the generatrix thereof, said solenoid being adapted for receiving a test sample, and magnetization and magnetizing field measuring channels cooperating with said magnetizing means, wherein said ellipsoidal solenoid is made with rectangular turns and has the geometrical dimensions thereof selected in agreement with the following relationship:

$$K = 0.9965 \quad \left(\frac{b_L}{L}\right) 0.4361 \quad \Bigg| \quad \frac{b_L}{L} \epsilon 0.1 \text{ to } 0.6$$
$$a = 0.05L$$

where K is the contraction coefficient of the solenoid generatrix, $2b_L$ is the width of the linear rectangular profile representing the geometrical locus of the cross section centers of said solenoid end turns, $2a$ is the height of the linear rectangular profile representing the geometrical locus of the cross section centers of said solenoid end turns, $2L$ is the solenoid length between the cross section centers of said end turns.

1 Claim, 4 Drawing Figures

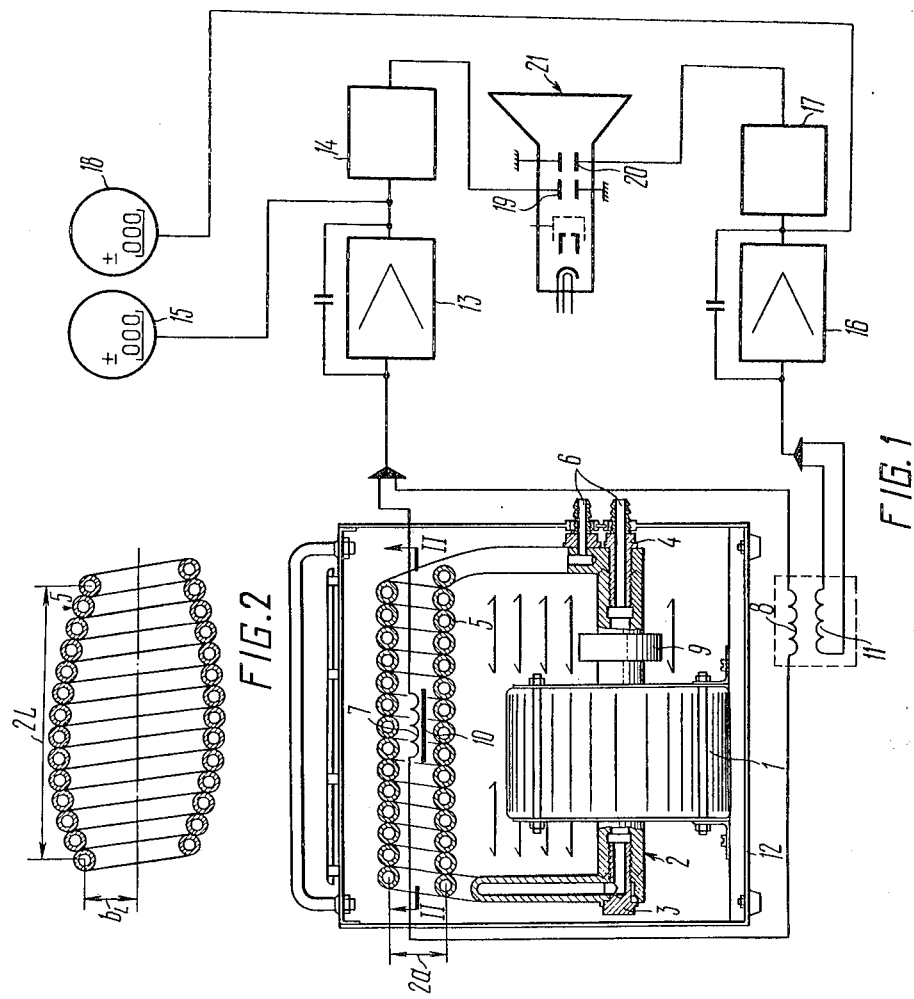

OSCILLOGRAPHIC FERROMETER

The present invention relates to devices for measuring magnetic values, and, more particularly, to the instruments known as oscillographic ferrometers. It may find application in rapid magnetic testing of samples and ferromagnetic units.

There are known oscillographic ferrometers comprising a magnetizing means and magnetization and magnetizing field measuring channels cooperating with the magnetizing means.

The magnetizing means includes a step-down transformer and a single-layer ellipsoidal solenoid connected to a single-turn secondary winding of the step-down transformer and having a constant turn density along its generatrix.

In the case of measuring the magnetic properties of thin steel sheets or plates of a considerable length at various steps of the production process, the utility factor of the solenoid inner volume is rather low, thus bringing about a drastic increase in the magnetizing means energy consumption.

The use of the prior art solenoids having rectangular turns would reduce the magnetizing means energy power consumption in this case, yet the field uniformity of such solenoids is low in comparison with the ellipsoidal ones wherein the field homogeneity improvement is achieved by selecting such functionally related geometrical dimensions of the solenoid that partially compensate for the field decay at the solenoid ends or poles, caused by the pole trancation, at the expense of the field augmentation at the solenoid ends gained by winding the solenoid coil with a constant turn pitch along the ellipsoid generatrix so that the turns axial density grows towards the solenoid ends.

It is an object of the present invention to provide an oscillographic ferrometer having a magnetizing means wherein the shape of turns and the relationship between the geometrical dimensions of the ellipsoidal solenoid are selected so as to ensure the mutual compensation of the end field decay caused by the solenoid pole truncation and the end field augmentation gained due to the ampere-turns density axial component growing from the solenoid center towards the poles, whereby the utility factor of the solenoid inner volume may be improved.

This object is attained in an oscillographic ferrometer comprising a magnetizing means including a step-down transformer and a single-layer ellipsoidal solenoid connected to a single-turn secondary winding of said step-down transformer and having a constant turn density along the generatrix thereof, said solenoid being adapted for receiving a test sample, and magnetization and magnetizing field measuring channels cooperating with said magnetizing means, wherein, according to the invention, said ellipsoidal solenoid is made with rectangular turns and has the geometrical dimensions thereof selected in agreement with the following relationship:

$$\begin{cases} K = 0.9965 \\ a = 0.05L \end{cases} \left(\frac{b_L}{L}\right) 0.4361 \quad \Big| \quad \frac{b_L}{L} \epsilon\ 0.1\ \text{to}\ 0.6$$

where K is the contraction coefficient of the solenoid generatrix, $2b_L$ is the width of the linear rectangular profile representing the geometrical locus of the cross section centers of said solenoid end turns, $2a$ is the height of the linear rectangular profile representing the geometrical locus of the cross section centers of said solenoid end turns, $2L$ is the solenoid length between the cross section centers of said end turns.

Further objects and advantages of the present invention will become apparent to those skilled in the art upon a further reading of this disclosure particularly when viewed in the light of the attached drawings, wherein:

FIG. 1 is an electric block diagram of an oscillographic ferrometer made in accordance with the invention;

FIG. 2 is a sectional view of the solenoid according to the invention taken along line II—II of FIG. 1;

Figure 4:
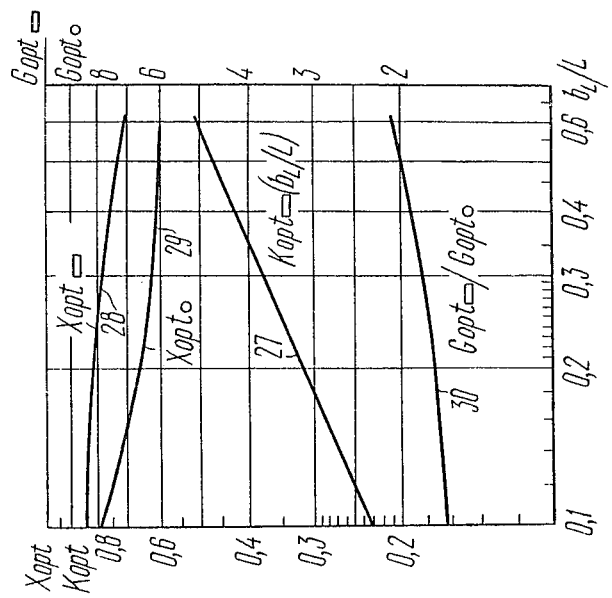
FIG. 4 is a graph showing the curves characterizing the optimum contraction coefficient values for the solenoid having rectangle-shaped turns, the field homogeneity zones of the solenoids having rectangular and round turns, and the form function ratio of the solenoids having rectangular and round turns.

Referring now to the drawings, the oscillographic ferrometer comprises a magnetizing means and magnetization and magnetizing field measuring channels.

The magnetizing device includes a step-down transformer 1 (FIG. 1) having a single-turn secondary winding 2, and an ellipsoidal solenoid 5 (FIGS. 1 and 2) connected to the single-turn secondary winding 2 by means of current-carrying members in the form of hollow studs 3,4. The solenoid 5 has rectangular turns of a hollow conductor wound at a constant pitch along the ellipsoid generatrix and is cooled down in series with the winding 2 by a liquid flowing through branches 6. The length 2L, the width $2b_L$ and the height $2a$ of the working opening and the ellipsoid generatrix contraction coefficient K of the solenoid are selected so as to be in agreement with the following functional relationship:

$$\begin{cases} K = 0.9965 \\ a = 0.05L \end{cases} \left(\frac{b_L}{L}\right) 0.4361 \quad \Big| \quad \frac{b_L}{L} \epsilon\ 0.1\ \text{to}\ 0.6$$

The solenoid 5 (FIG. 1) has a magnetization measuring coil 7 mounted within the inner space thereof coaxially with the field and connected in an opposed series relationship to a toroidal compensation coil 8 linked with the current-carrying member field and whose constant $\omega$ S is equal to that of the measuring coil 7. A non-magnetic frame 9 of the coil 8 is mounted coaxially with the adjacent current-carrying member. A test sample 10 is placed into the measuring coil and oriented so that it is coaxial with the magnetic field of the solenoid 5. A field pick-up coil 11 is wound on the same non-magnetic frame 9 together with the compensation coil 8. The magnetizing device components and assemblies are enclosed in a housing 12. The measuring and compensation coils 7 and 8, respectively, are connected in an opposed series relationship to the input of the magnetization channel including an integrating amplifier 13, a phase corrector 14 and a calibrator 15.

The field pick-up coil 11 is connected to the input of an integrator 16 of the magnetizing field measuring channel including also a phase corrector 17 and a calibrator 18. The outputs of the phase correctors 14 and 17 are fed to vertical deflection plates 19 and horizontal deflection plates 20, respectively, of a cathode-ray tube 21.

The operation of the oscillographic ferrometer is as follows:

The relationship of the geometrical dimensions of the ellipsoidal solenoid having rectangle-shaped turns provides for a mutual compensation effect at the central region thereof with respect to the end field decay caused by the solenoid pole truncation and a field augmentation gained due to the ampere-turns density axial component growing from the solenoid center towards the pole ends. This permits the expansion of the field homogeneity zone. The above-mentioned relationship is found in the following way.

The field axial component in the solenoid:

$$H_x(x,o,o) = \frac{\delta}{\delta x} \int_{-L}^{+L} \Omega \, dl,$$

where $$\Omega = \int_{-a}^{+a} \int_{-b\xi}^{+b\xi} \frac{(x-\xi) \, dz' dy'}{[(x-\xi)^2 + (y-y')^2 + (z-z')^2]^{3/2}}$$

is the spatial angle at which an elementary rectangular linear profile having coordinate dimensions $a \times b$ (with the coordinate center coinciding with the solenoid center) can be seen at the point $x$ of the axis.

$dI = jS \cdot dS$ is the current in the elementary profile, $j_S = \omega \, I/S$ is the ampere-turns density along the ellipsoid generatrix S, I is the solenoid current.

After transforming, we get $H_x(x,o,o) = 0.2 j_S G$, where the dimensionless function is dependent only on the solenoid shape and $$G = \int_{-1}^{+1} \frac{a[\psi(\xi) + (x-\xi)^2][b^2 - K^2(1-K^2)\xi^2]^{1/2}}{\psi^{1/2}(\xi)[(x-\xi)^2 \psi(\xi) + a^2(b^2-K^2\xi^2)]}$$

This function hereinafter referred to as the form function cannot be expressed in terms of the elementary functions $$\psi(\xi) = a^2 + b^2 - K^2 \xi^2 (x - \xi)^2$$
$$b_2 = K^2 + b_L^2,$$

where K is the ellipsoid generatrix contraction coefficient.

Solving the equation $x_{opt}(b_L, a, K) = \max$ in the region $x \in 0$ to $xH$ where the condition $$\frac{G(b_L, a, K, O) - G(b_L, a, k, x_H)}{G(b_L, a, K, O)} \leq H - 0.00$$

is met, we can find the relationship for the optimum dimensions measured at the turns end cross sections along the axis lines according to the principle of the mean geometrical distances $$\begin{cases} K_{opt} = 0.9965 \, (b_L/L) \, 0.4361 \\ a_{opt} = 0.05L \end{cases} \quad b_L/L \in 0.1 \text{ to } 0.6$$

at which the compensation effect will be attained.

Figure 3:
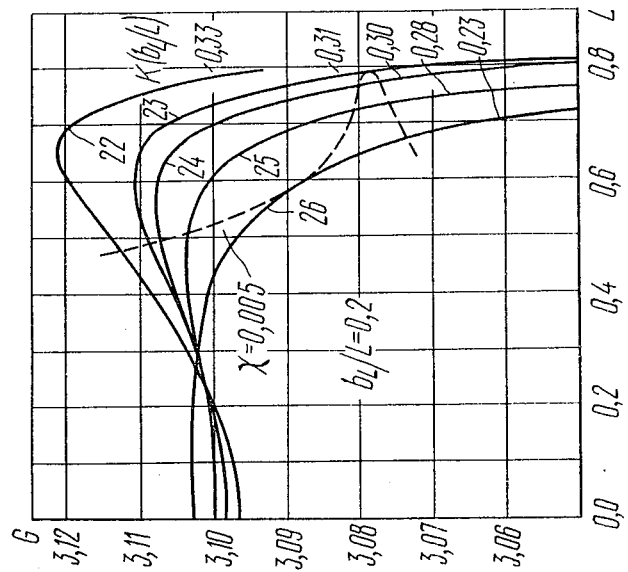
FIG. 3 is the magnetic field topography illustrating the compensation effect at various relationships of the geometrical dimensions of the solenoid according to the invention.

FIG. 3 presents an example of the field topography plotted on the basis of the computer calculated data illustrating the compensation effect at various dimension relationships. The curves of distribution of the form function G along the axis X at a fixed value of $b_L/L = $ const and a contraction coefficient value of K = 0.33, 0.31, 0.30, 0.28, 0.23 demonstrate that the upward slope of a curve 22 (K=0.33) is steeper than that of a curve 23 (K = 0.31) and it is continuously diminishing in the case of curves 24 (K = 0.30) and 25 (K = 0.28), while the curve 26 (K ± 0.23) lacks the ascent. Hence, the compensation effect makes itself prominent within the range of values K ∈ 0.23 to 0.28, and the optimum value of $K_{opt}$ may be determined the more accurately, the lesser the step of K realized with the aid of a digital computer.

The pick-up signals $dJ/dt$ and $dH/dt$ are fed to the channels J and H where they are integrated and phase corrected within the frequency range starting from the magnetization frequency. Then the signals are fed to the plates of the cathode-ray tube for displaying the dynamic magnetization or hysteresis curve J (H).

The advantageous features of the oscillographic ferrometer according to the invention are characterized by the qualitative data of the preproduction model, which are illustrated in FIG. 4 as follows.

For the contraction coefficient optimum values of the solenoid having rectangular turns, $K_{opt \, \square} \, (b_L/L)$, which are represented by the curve 27, the field homogeneity zone is not worse than ±0.005; the rectangular turn solenoids, $x_{opt \, \square}$ (curve 28) always have greater homogeneity zones than the round-turn solenoids, $x_{opt \, o}$, (curve 29) having the same value of $K_{opt}$, and $x_{opt \, \square}/x_{opt \, o} \in 1.06$ to 1.27 when the working opening diameter $2R_L$ of the round turn solenoid equals to the working opening width of the rectangular turn solenoid ($R_L = b_L$).

The curve 30 charcterizing the relationship between the form functions $G_{opt \, \square}$ of the rectangular turn solenoids and the form functions $G_{opt \, o}$ of the round turn solenoids at $K_{opt}$ and $R_L = b_L$ shows that $G_{opt \, \square}/G_{opt \, o} \in 1.65$ to 2.01.

Since the form function is proportional to the solenoid magnetic efficiency in a first approximation, the advantages of the ellipsoidal solenoid having rectangle-shaped turns will be quite apparent to those skilled in the art.

What is claimed is:

1. An oscillographic ferrometer comprising: a magnetizing means producing a magnetic field for placing a test sample thereinto; a magnetization measuring channel cooperating with said magnetizing means; a magnetizing field measuring channel cooperating with said magnetizing means and effecting together with said magnetization measuring channel the measurements of dynamic magnetization loop parameters of said test sample; said magnetizing means including a step-down transformer having a single-turn secondary winding, a single-layer ellipsoidal solenoid connected to said secondary winding and having a constant density of rectangle-shaped turns along the generatrix thereof, said solenoid being adapted for receiving a test sample and having the geometrical dimensions thereof selected in agreement with the following relationship:

$$K = 0.9965 \left(\frac{b_L}{L}\right) 0.4361 \quad \Big| \quad \frac{b_L}{L} \in 0.1 \text{ to } 0.6$$
$$a = 0.05L$$

where K is the contraction coefficient of said solenoid generatrix, $2b_L$ is the width of the linear rectangular profile representing the geometrical locus of the cross section centers of said solenoid end turns;

$2a$ is the height of the linear rectangular profile representing the geometrical locus of the cross section centers of said solenoid end turns, $2L$ is the length of said solenoid between the cross section centers of said end turns.

* * * * *